United States Patent
Aipperspach et al.

(10) Patent No.: US 8,513,815 B2
(45) Date of Patent: Aug. 20, 2013

(54) IMPLEMENTING INTEGRATED CIRCUIT MIXED DOUBLE DENSITY AND HIGH PERFORMANCE WIRE STRUCTURE

(75) Inventors: Anthony G. Aipperspach, Rochester, MN (US); Todd A. Christensen, Rochester, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 13/187,758

(22) Filed: Jul. 21, 2011

(65) Prior Publication Data
US 2013/0020712 A1  Jan. 24, 2013

(51) Int. Cl.
*H01L 23/528* (2006.01)
(52) U.S. Cl.
USPC .......... 257/774; 257/E23.145; 257/E23.152; 257/E21.579; 438/626; 438/633; 438/638
(58) Field of Classification Search
USPC ....... 438/626, 633, 638, FOR. 355; 257/774, 257/E23.145, E23.152, E21.579
See application file for complete search history.

(56) References Cited

U.S. PATENT DOCUMENTS

| | | | |
|---|---|---|---|
| 2003/0027386 A1* | 2/2003 | Lee | 438/253 |
| 2004/0214410 A1 | 10/2004 | Fricke et al. | |
| 2005/0093169 A1* | 5/2005 | Kajita | 257/774 |
| 2006/0113520 A1 | 6/2006 | Yamamoto et al. | |
| 2009/0072404 A1 | 3/2009 | Kikuchi et al. | |
| 2010/0283026 A1 | 11/2010 | Mikawa et al. | |
| 2010/0308464 A1* | 12/2010 | Tsutsue et al. | 257/758 |
| 2011/0110052 A1 | 5/2011 | Ohmi et al. | |
| 2012/0280401 A1* | 11/2012 | Tsutsue et al. | 257/774 |

FOREIGN PATENT DOCUMENTS

| | | |
|---|---|---|
| JP | 02004304401 A | 10/2004 |
| JP | 02009252919 A1 | 10/2009 |

OTHER PUBLICATIONS

M. B. Small et al, "On-chip wiring for VLSI—Status and directions", IBM J. Res. Develop. vol. 34 No. 6, Nov. 1990, pp. 858-867.

* cited by examiner

*Primary Examiner* — George Fourson, III
(74) *Attorney, Agent, or Firm* — Joan Pennington

(57) ABSTRACT

A method and structures are provided for implementing an integrated circuit with an enhanced wiring structure of mixed double density and high performance wires in a common plane. A wiring structure includes a first wire having a first plane and a first via to a second wire in a second plane having a second via and a third wire having the first plane with height equal to the first wire and the first via, and a third via having a height equal to the second wire and the second via.

20 Claims, 6 Drawing Sheets

IMPLEMENTING INTEGRATED CIRCUIT MIXED DOUBLE DENSITY AND HIGH PERFORMANCE WIRE STRUCTURE

FIELD OF THE INVENTION

The present invention relates generally to the data processing field, and more particularly, relates to a method and integrated circuit structures for implementing mixed double density and high performance wiring planes.

DESCRIPTION OF THE RELATED ART

As technology progresses and transistor density increases, more and more integration of different functions on the same chip is enabled, for example, such as multiple different functions in a System on a Chip (SOC). It becomes more common to integrate functions that operate at different frequencies. For example, typically game chips integrate a high frequency Central Processing Unit (CPU) and a lower frequency Graphics Processing Unit (GPU).

High frequency designs need higher performance wire interconnects which have lower resistance, reducing the resistor capacitor (RC) delay of the wires. This results in thicker wires which need expanded ground rules and which result in a lower density of wires.

Lower frequency designs can be handled with higher resistance wires since the frequency is more relaxed. These designs are typically very area optimized and need a higher density of wires. Higher resistance wire interconnects are typically thinner which result in higher RC delays of the wires but can be designed with more aggressive ground rules which result in a higher density of wires. If the high performance portion of the design uses lower performance wires then the achievable performance will be limited. If the low performance portion of the design uses high performance wires then the area will be increased which results in higher cost.

A need exists to have increased high density wiring planes in a low performance portion simultaneously with high performance wires in a high performance portion of an integrated circuit.

SUMMARY OF THE INVENTION

Principal aspects of the present invention are to provide a method and structures for implementing an integrated circuit with mixed double density and high performance wire structure. Other important aspects of the present invention are to provide such method and structures substantially without negative effects and that overcome many of the disadvantages of prior art arrangements.

In brief, a method and structures are provided for implementing an integrated circuit with a wiring structure of mixed double density and high performance wires in a common plane. A wiring structure includes a first wire having a first plane and a first via to a second wire in a second plane having a second via and a third wire having the first plane with height equal to the first wire and the first via, and a third via having a height equal to the second wire and the second via.

In accordance with features of the invention, enhanced wiring structure fabrication is provided utilizing respective selected ground rules for the first wire and second wire, and the third wire. For example, the ground rules for metal line width and space for the first wire and second wire include 40 nm width and 40 nm space and the ground rules for metal line width and space for the third wire include 80 nm line width and 80 nm space.

In accordance with features of the invention, various respective ground rules are selected for the first wire and second wire, and the third wire to generally provide any ratio of high density and low density wires.

In accordance with features of the invention, the wiring structure is configured to have increased high density wires in the low performance portion simultaneously with high performance wires in the high performance portion of the integrated circuit.

In accordance with features of the invention, the wiring structure is formed on a starting metal layer with an oxide deposited, providing a planarized oxide in the integrated circuit. A photoresist is applied to the oxide, patterned and the oxide etched to the wiring plane of the second or bottom metal wire and the top of the third via. Another layer of photoresist is applied with hardening of the existing photoresist, patterned for the bottom or second via and the bottom of the third via, and then the oxide etched to the starting metal layer. The photoresist is removed, then a thin conformal interface layer is deposited between the oxide and etched openings and then metal is deposited filling the second wire and second via and the third via and then planarized. The metallurgy depositions and planarization polish is provided to the second or bottom wire, second via and third via simultaneously. Then an oxide is deposited, photoresist is applied and patterned, and the oxide etched for the first metal wire and the top of the third wire. Another layer of photoresist is applied with hardening of the existing photoresist, patterned for the top or first via and the bottom of the third wire, and then the oxide etched to the second wiring plane for the first via and the bottom of the third wire. The photoresist is removed, then a thin conformal interface layer is deposited between the oxide and then metal is deposited filling the first wire and first via and the third wire and then planarized. The metallurgy depositions and planarization polish is done to both the first wire, first via and third wire simultaneously.

In accordance with features of the invention, this entire process and the wiring structure can be repeated over and over providing multiple levels of wiring structures.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
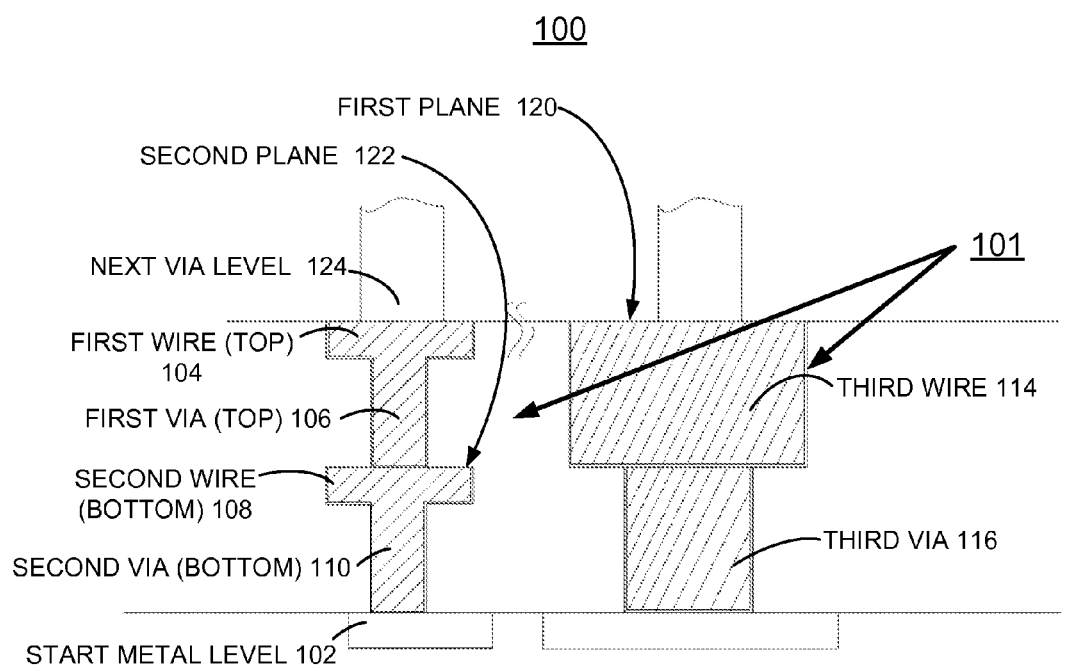
FIG. 1 shows a side view of an integrated circuit wiring planes including an integrated circuit mixed double density and high performance wire structure in accordance with the preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings the same reference number are used in FIGS. 1-11 for identical or similar components or elements.

An enhanced fabrication method and structures are provided for implementing an integrated circuit with an enhanced wiring structure of mixed double density and high performance wires in a common plane.

Having reference now to the drawings, in FIG. 1, there is shown an integrated circuit 100 including an integrated circuit mixed double density and high performance wire structure generally designated by the reference character 101 in accordance with the preferred embodiment.

Wiring structure 101 is formed at a selected start metal level 102. Wiring structure 101 includes a first or top wire 104 and a first via 106 extending to a second wire or bottom 108 and a second via 110 and a third wire 114 having a height equal to the first wire 104 and the first via 106, and a third via 116 having a height equal to the second wire 108 and the second via 110. The first wire 104 and the third wire 114 have a common first plane 120. The third via 116 and the second wire 108 include a common second plane 122. A next via level 124 is shown above the wiring structure 101.

In accordance with features of the invention, the wiring structure 101 is configured to have common planes 120, 122 with increased high density wires 104, 108 and vias 106, 110 in a low performance portion simultaneously with high performance wires 114 and via 116 in a high performance portion of the integrated circuit 100.

Enhanced wiring structure fabrication is provided utilizing respective selected ground rules for the first wire 104, via 106, the second wire 108, via 110, and the third wire 114 and via 116. For example, the ground rules for metal line width and space for the first wire 104, via 106 and the second wire 108, via 110 include 40 nm width and 40 nm space and the ground rules for metal line width and space for the third wire 114 and the via 116 include 80 nm line width and 80 nm space.

In accordance with features of the invention, various respective ground rules are selected for the first wire and second wire, and the third wire to generally provide any ratio of high density and low density wires.

FIGS. 2, 3, 4, 5, 6, 7, 8, 9, 10, and 11 illustrate exemplary processing steps for fabricating an integrated circuit mixed double density and high performance wire structure 101 in accordance with the preferred embodiment.

Figure 2:
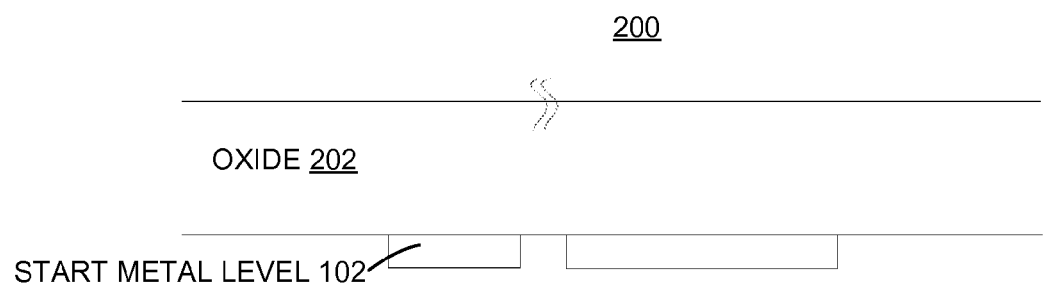
FIGS. 2, 3, 4, 5, 6, 7, 8, 9, 10, and 11 illustrate exemplary processing steps for fabricating an integrated circuit mixed double density and high performance wire structure in accordance with the preferred embodiment.

Referring to FIG. 2, processing steps generally designated by the reference character 200 begin on a starting metal layer 102 with an oxide 202 being deposited providing a planarized oxide in the integrated circuit 100.

Figure 3:
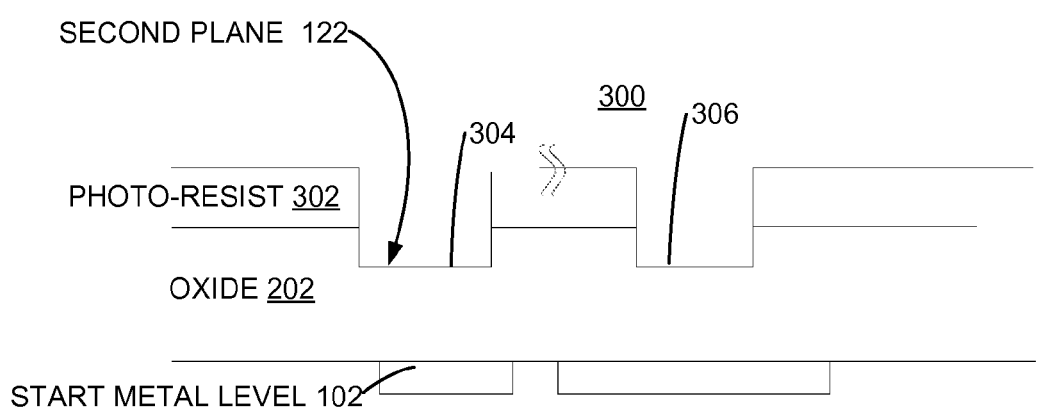

Referring to FIG. 3, in processing steps generally designated by the reference character 300, a photoresist 302 is applied to the oxide, patterned and the oxide etched as indicated at 304 to the wiring plane 122 of the second or bottom metal wire 108 and to the top of the third via 116 as indicated at 306.

Figure 4:
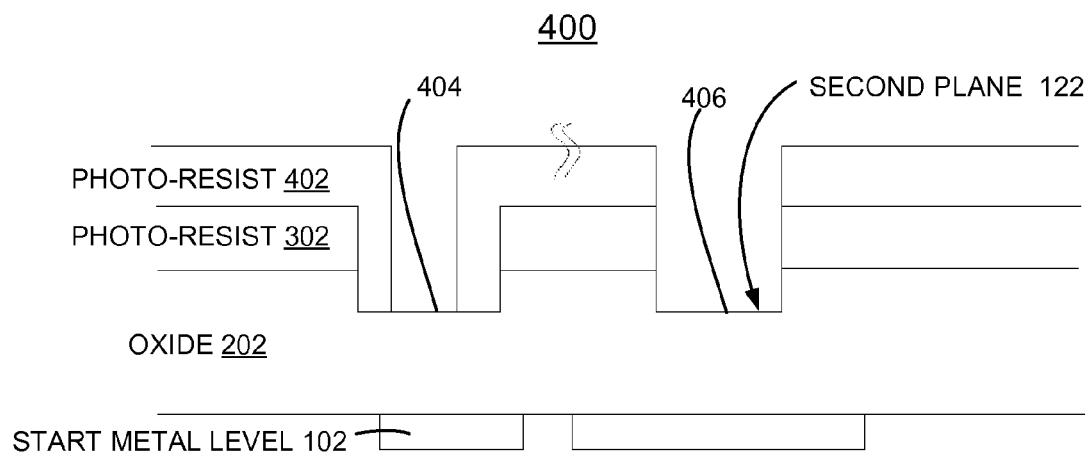

Referring to FIG. 4, in processing steps generally designated by the reference character 400, another layer of photoresist 402 is applied with hardening of the existing photoresist 302, patterned for the bottom or second via 110 as indicated at 404 and the bottom of the third via 116 as indicated at 406.

Figure 5:
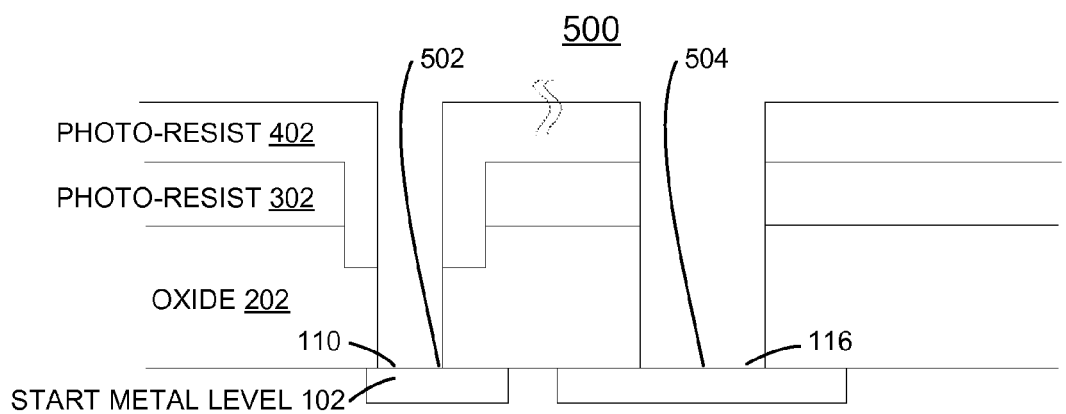

Referring to FIG. 5, in processing steps generally designated by the reference character 500, the oxide 202 is etched for the second via 110 and the third via 116 as indicated at 502 and 504 to the starting metal layer 102.

Figure 6:
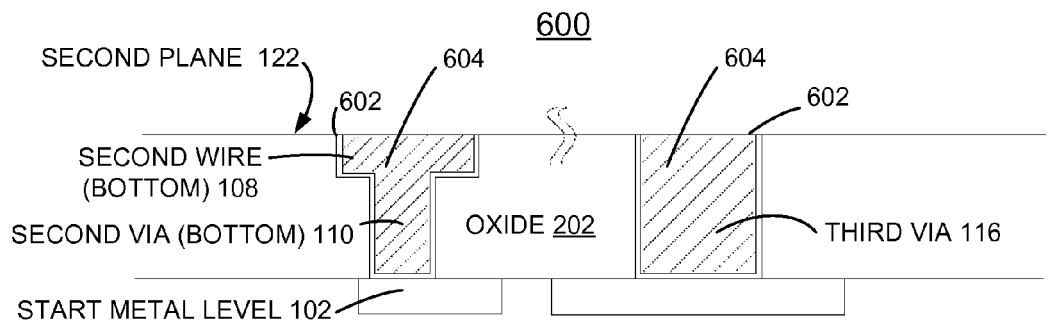

Referring to FIG. 6, in processing steps generally designated by the reference character 600, the photoresist 304, 402 is removed, then a thin conformal interface layer 602 is deposited between the oxide and etched portions 502, 504, and then metal 604 is deposited filling the second wire 108 and second via 110 and the third via 116, and then planarized. The metallurgy depositions and planarization polish is done to the second or bottom wire 108, second via 110 and third via 116 simultaneously.

Figure 7:
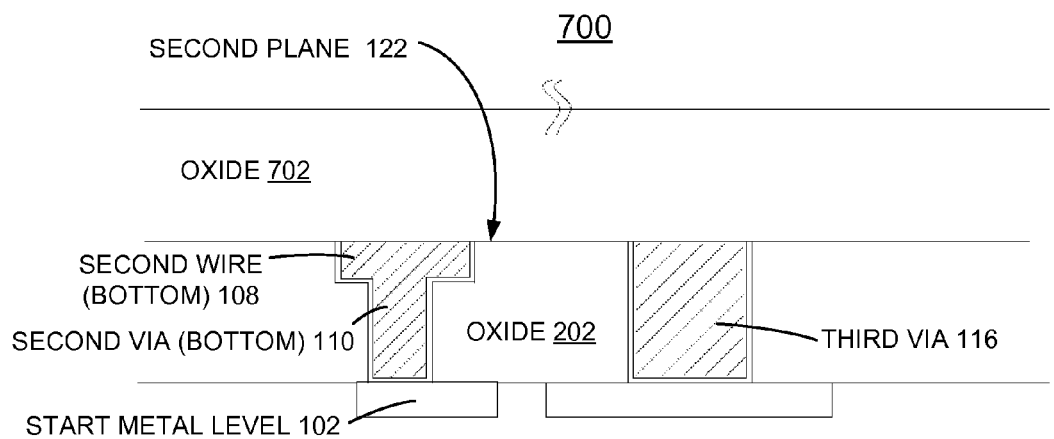

Referring to FIG. 7, in processing steps generally designated by the reference character 700, a next oxide 702 is deposited at level of the second plane 122.

Figure 8:
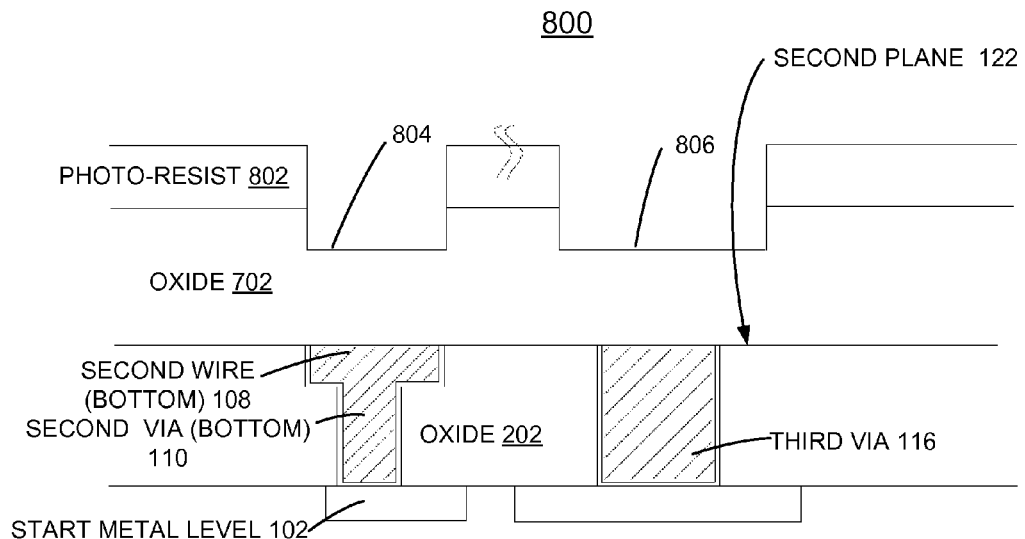

Referring to FIG. 8, in processing steps generally designated by the reference character 800, a photoresist 802 is applied and patterned and the oxide 702 is etched for the first metal wire 104 and the top of the third wire 114 as indicated at 804, and 806.

Figure 9:
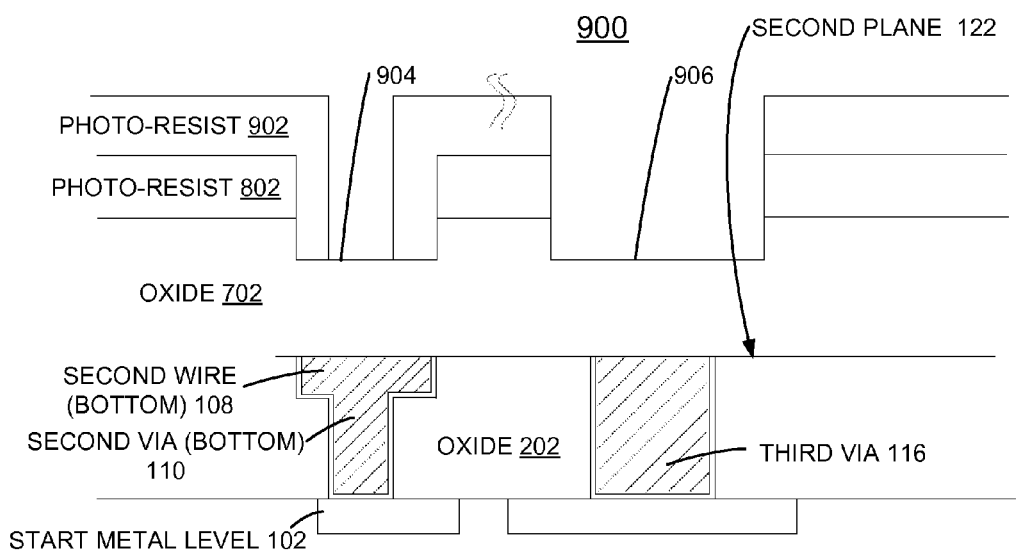

Referring to FIG. 9, in processing steps generally designated by the reference character 900, another layer of photoresist 902 is applied with hardening of the existing photoresist 802, patterned and etched as indicated at 904, 906 for the top or first via 106 and the bottom of the third wire 114.

Figure 10:
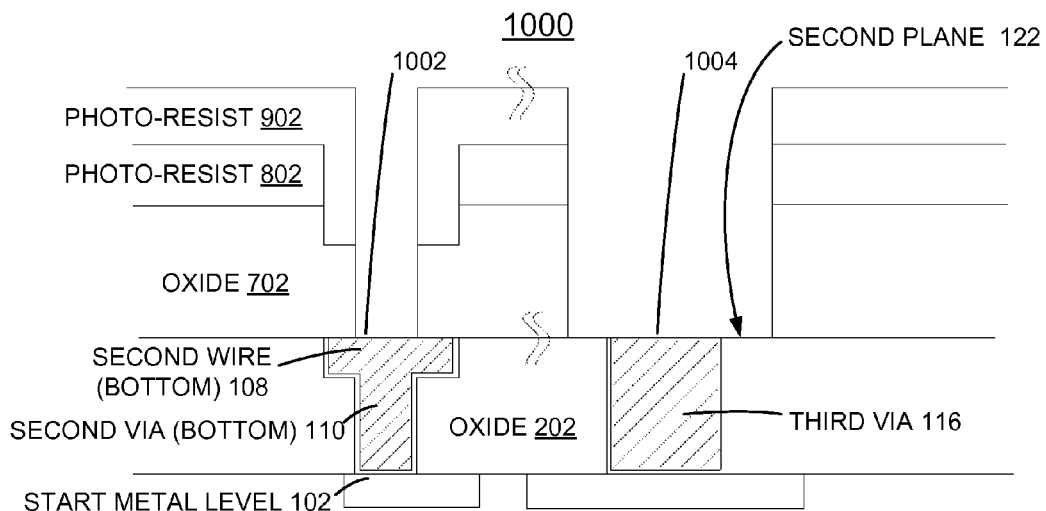

Referring to FIG. 10, in processing steps generally designated by the reference character 1000, then the oxide 702 is etched to the second wiring plane 122 for the first via 106 and the third wire 114 as indicated at 1002, 1004.

Figure 11:
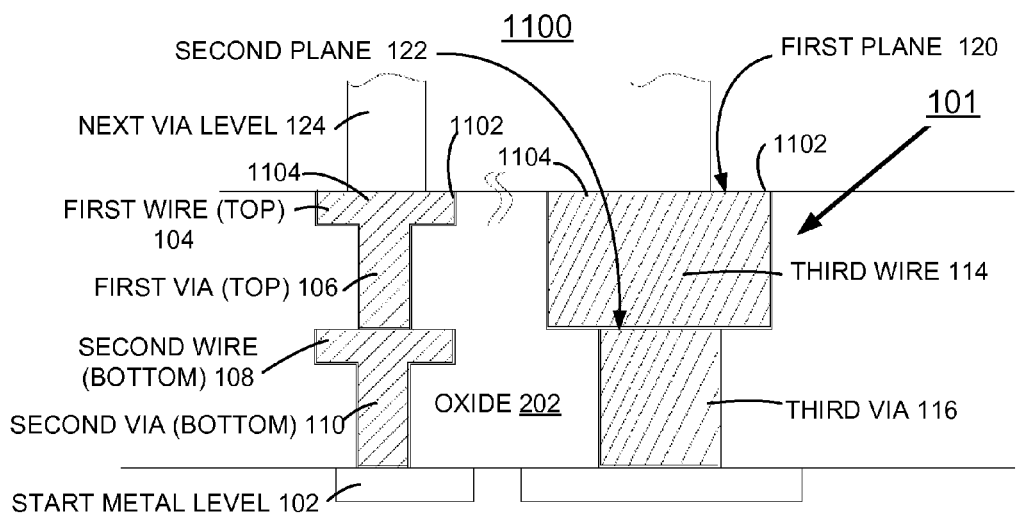

Referring to FIG. 11, in processing steps generally designated by the reference character 1100, the photoresist 802, 902 is removed, then a thin conformal interface layer 1102 is deposited between the oxide and the etched portions for first wire 104, first via 106 and the third wire 114. Then metal 1104 is deposited filling the first wire 104 and first via 106 and the third wire 114 and then planarized. The metallurgy depositions and planarization polish is done to both the first wire 104, first via 106, and third wire 114 simultaneously. A completed wiring structure 101 is provided as shown in FIG. 11.

In accordance with features of the invention, this entire process as shown in FIGS. 2-11, and the wiring structure 101 shown in FIGS. 1 and 11 can be repeated over and over above multiple wiring structure levels in the integrated circuit 100.

While the present invention has been described with reference to the details of the embodiments of the invention shown in the drawing, these details are not intended to limit the scope of the invention as claimed in the appended claims.

What is claimed is:

1. A wiring structure of an integrated circuit with mixed double density and high performance wires in a common wiring plane, said wiring structure comprising:
   a first wire having a first plane and a first via;
   a second wire in a second plane having a second via; said first via extending to said second plane of said second wire; and
   a third wire having the first plane of said first wire and a third via; said third wire having a height equal to a combined height of said first wire and said first via, and said third via having a height equal to a combined height of said second wire and said second via.

2. The wiring structure as recited in claim 1 wherein each of said first wire and said second wire has a higher resistance than said third wire.

3. The wiring structure as recited in claim 1 wherein said third wire has lower resistance than said first wire and said second wire.

4. The wiring structure as recited in claim 1 wherein said first wire and said second wire and said third wire are defined using respective selected ground rules.

5. The wiring structure as recited in claim 4 wherein said respective ground rules are selected for said first wire and second wire and said third wire to provide a set ratio of high density and low density wires.

6. The wiring structure as recited in claim 1 wherein the wiring structure is configured to have increased high density wires including said first wire and said second wire in a low performance portion of the integrated circuit simultaneously with high performance wires including said third wire in a high performance portion of the integrated circuit.

7. The wiring structure as recited in claim 1 wherein said third wire includes a larger metal line width and a larger space than a metal line width and a space said first wire and said second wire.

8. The wiring structure as recited in claim 1 wherein a metal line width and space for said first wire and said second wire include 40 nm width and 40 nm space.

9. The wiring structure as recited in claim 8 wherein said metal line width and space for said third wire include 80 nm line width and 80 nm space.

10. A method for implementing for implementing an integrated circuit with a wiring structure of mixed double density and high performance wires in a common wiring plane, said method comprising:
   forming a first wire having a first plane and a first via;
   forming a second wire in a second plane having a second via; said first via extending to said second plane of said second wire; and
   forming a third wire having the first plane of said first wire and a third via; said third wire having a height equal to a combined height of said first wire and said first via, and said third via having a height equal to a combined height of said second wire and said second via.

11. The method as recited in claim 10 includes using respective selected ground rules for forming said first wire, said second wire, and said third wire.

12. The method as recited in claim 10 wherein forming said first wire and said second wire and said third wire includes forming said first wire and said second wire in a low performance portion of the integrated circuit simultaneously with forming said third wire in a high performance portion of the integrated circuit.

13. The method as recited in claim 10 wherein forming each of said first wire and said second wire and said third wire includes depositing an oxide, and applying a photoresist to the oxide.

14. The method as recited in claim 13 further includes patterning and etching the oxide.

15. The method as recited in claim 14 further includes applying another layer of photoresist, and patterning and etching the oxide.

16. The method as recited in claim 15 includes applying a conformal interface layer between the oxide and etched portions and depositing a metal for forming said first wire and said second wire and said third wire.

17. The method as recited in claim 10 wherein each of said first wire and said second wire has a higher resistance than said third wire.

18. The method as recited in claim 10 wherein said third wire has lower resistance than said first wire and said second wire.

19. The method as recited in claim 10 wherein forming said third wire includes using a larger metal line width and a larger space than a metal line width and a space for said first wire and said second wire.

20. The method as recited in claim 10 wherein forming said first wire and said second wire and said third wire includes using selected respective ground rules for said first wire and second wire and said third wire to provide a set ratio of high density and low density wires.

* * * * *